(12) United States Patent
Kim et al.

(10) Patent No.: US 9,147,859 B2
(45) Date of Patent: Sep. 29, 2015

(54) ORGANIC LIGHT EMITTING DISPLAY DEVICE AND METHOD FOR MANUFACTURING THE SAME

(75) Inventors: Jongmoo Kim, Seoul (KR); Juhnsuk Yoo, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 958 days.

(21) Appl. No.: 13/310,645

(22) Filed: Dec. 2, 2011

(65) Prior Publication Data
US 2012/0139821 A1    Jun. 7, 2012

(30) Foreign Application Priority Data
Dec. 3, 2010   (KR) .................. 10-2010-0122819

(51) Int. Cl.
*H01L 33/52*     (2010.01)
*H01L 51/52*     (2006.01)
*H05B 33/00*     (2006.01)

(52) U.S. Cl.
CPC ............ *H01L 51/5253* (2013.01); *H05B 33/00* (2013.01)

(58) Field of Classification Search
None
See application file for complete search history.

(56) References Cited

U.S. PATENT DOCUMENTS

| 2004/0080267 A1 | 4/2004 | Cok |
| 2005/0104516 A1 | 5/2005 | Park et al. |
| 2009/0322214 A1 | 12/2009 | Lee et al. |
| 2011/0199348 A1 | 8/2011 | Takatani et al. |

FOREIGN PATENT DOCUMENTS

| CN | 102376748 A | 3/2012 |
| JP | 2005-150076 A | 6/2005 |
| KR | 10-2010-0001275 A | 1/2010 |
| WO | 2010/044291 | 4/2010 |

*Primary Examiner* — Ashok Patel
(74) *Attorney, Agent, or Firm* — Morgan, Lewis & Bockius LLP

(57) ABSTRACT

The present disclosure relates to an organic light emitting display device and a method for manufacturing the same. The present disclosure suggests an organic light emitting display device including an organic layer; a display element layer including a display area representing video data and a pad area extended from the display area, on the organic layer; film elements formed on the display element layer; a film type printed circuit board connected to the pad area; and a reinforcing adhesive filling a space between the film type printed circuit board and the film elements.

9 Claims, 6 Drawing Sheets

ORGANIC LIGHT EMITTING DISPLAY DEVICE AND METHOD FOR MANUFACTURING THE SAME

This application claims the benefit of Korea Patent Application No. 10-2010-0122819 filed on Dec. 3, 2010, which is incorporated herein by reference for all purposes as if fully set forth herein.

BACKGROUND OF THE INVENTION

1. Field of the Invention

The present disclosure relates to an organic light emitting display device (or, OLED) and a method for manufacturing the same. Especially, the present disclosure relates to an organic light emitting display device including active organic light emitting diodes on a flexible substrate and a method for manufacturing the same.

2. Discussion of the Related Art

Nowadays, various flat panel display devices are developed for overcoming many drawbacks of the cathode ray tube, such as heavy weight and bulk volume. The flat panel display devices include the liquid crystal display device (or LCD), the field emission display (or FED), the plasma display panel (or PDP) and the electroluminescence display device (or ED).

The electroluminescence display device is categorized in the inorganic light emitting diode display device and the organic light emitting diode display device according to the luminescence material. As a self-emitting display device, the electroluminescence display device has the merits those the response speed is very fast, the brightness is very high and the view angle is large. FIG. 1 illustrates the structure of the organic light emitting diode according to the related art. Referring to FIG. 1, the organic light emitting diode comprises the organic light emitting material layer, and the cathode and the anode which are facing each other with the organic light emitting material layer therebetween. The organic light emitting material layer comprises the hole injection layer HIL, the hole transport layer HTL, the emission layer EML, the electron transport layer ETL and the electron injection layer EIL.

The organic light emitting diode radiates the lights due to the energy from the excition formed at the excitation state in which the hole and the electron are recombined at the emission layer EML. The organic light emitting display device represents the video data by controlling the light brightness from the emission layer EML of the organic light emitting diode.

The organic light emitting diode display (or OLED) using the organic light emitting diode can be categorized in the passive matrix type organic light emitting diode display (or PMOLED) and the active matrix type organic light emitting diode display (or AMOLED). Furthermore, according to the direction of the emitted light, it can be categorized in the top emission type and the bottom emission type.

The flexible active matrix type organic light emitting diode display (or Flexible AMOLED) shows the video data by controlling the current applying to the organic light emitting diode using the thin film transistor (or TFT). The display module of the flexible AMOLED is made by that the active matrix type organic light emitting diode is formed on a thin polyimide substrate, then a protective cap, the barrier film, the circular polarization film, and the circuit on film (or COF) for mounting the driving IC are sequentially stacked and the COF is connected to the external PCB, and then the cover plate is attached. During the various films are stacked, some step differences can be occurred. Due to the step differences, the cover plate cannot be assembled in the evenly plane state. In addition, if, due to the step differences, there are some failures when the COF is attached to the display panel, the reliability of the display module can be seriously degraded.

SUMMARY OF THE INVENTION

In order to overcome the above mentioned drawbacks, one purpose of the present disclosure is to suggest a method for manufacturing a display module in which the step differences occurring stacking various films are minimized and the contact reliability between the pad and the film type printed circuit board (or PCB) is enhanced. Another purpose of the present disclosure is to suggest a display panel having no step differences between each stacked film layers and the enhanced contact reliability between the pad and the film type printed circuit board.

In order to accomplish the above purpose, the present disclosure suggests an organic light emitting display device comprising: an organic layer; a display element layer comprising a display area representing video data and a pad area extended from the display area, on the organic layer; film elements formed on the display element layer; a film type printed circuit board connected to the pad area; and a reinforcing adhesive covering the film type printed circuit board and filling a space between the film type printed circuit board and the film elements. In some embodiments, the organic light emitting display device further comprises an adhesive layer covering the organic layer and the film elements; and a cover plate attached on the adhesive layer.

The reinforcing adhesive may include an acryl group material and/or a silicon group material.

The reinforcing adhesive may cover an upper space of an upper surface of the film type printed circuit board attached on the pad area and an upper exposed space from the pad area to the adhesive layer.

The cover plate may include a cover film and/or a cover glass or cover plastic.

The film elements may comprise: a thin-film type cap encapsulating the display area; a barrier film covering the thin-film type cap and the display area; and a polarization film attached on the barrier film covering the display area. In some embodiments, the reinforcing adhesive may cover an upper space of an upper surface of the film type printed circuit board attached on the pad area and an upper exposed space from the pad area to the polarization film.

The adhesive layer may include a material selected from an acrylate esters group material, an acrylate urethanes group material, a mercaptons group material, a photo-initiator group material, and the combination thereof.

The organic light emitting display device may further comprise: a protective film attached on a rear side of the organic layer.

The organic layer may include a polyimide.

Furthermore, the present disclosure suggests a manufacturing method of an organic light emitting display device comprising: depositing a silicon layer including amorphous silicon material on a base substrate; depositing an organic layer on the silicon layer; forming a display element layer including a display area representing video data and a pad area extended from the display area, on the organic layer; depositing film elements on the display element layer; connecting a film type printed circuit board mounting a driving IC to the pad area; and filling a reinforcing adhesive in a space between the film type printed circuit board and the film elements.

The reinforcing adhesive may include acryl group material and/or silicon group material.

The reinforcing adhesive may cover an upper space of an upper surface of the film type printed circuit board attached on the pad area and an upper exposed space from the pad area to an end of the display area.

The depositing film elements on the display element layer may comprise: encapsulating the display area with a thin-film type cap; covering the thin-film type cap and the display area with a barrier film; and attaching a polarization film on the barrier film covering the display area.

The method may further comprise: depositing an adhesive layer on an area corresponding to the organic layer having the film elements; attaching a cover glass or cover plastic on the adhesive layer; and irradiating a laser beam to the silicon layer to separate the base substrate and the organic layer which are positioned at both sides of the silicon layer.

The method may further comprise: connecting the film type printed circuit board to an external printed circuit board; and attaching a protective film on a rear side of the organic layer.

The method may further comprise: depositing an adhesive layer on an area corresponding to the organic layer having the film elements; attaching a cover film on the adhesive layer; depositing a temporary adhesive layer on the cover film; attaching a cover glass or cover plastic on the temporary adhesive layer; irradiating a laser beam to the silicon layer to separate the base substrate and the organic layer which are positioned at both sides of the silicon layer; connecting the film type printed circuit board to an external printed circuit board; attaching a protective film on a rear side of the organic layer; and irradiating an ultra violet light to the temporary adhesive layer to remove the cover glass or cover plastic from the cover film.

The organic light emitting display device according to some embodiments of the present disclosure is manufactured by forming an organic light emitting diode on a thin organic layer, stacking various films comprising the display module, fixing and connecting the pad and film type printed circuit board with a reinforced adhesive, so that the contact reliability and the connecting reliability are enhanced. Assembling the cover plate using the optical adhesive to reduce the step differences due to the multi stacked structure, the display module panel can be maintained in the evenly plane condition. Furthermore, the present disclosure also provides a display panel module having an organic light emitting diode on a flexible organic substrate and a method for manufacturing the same.

BRIEF DESCRIPTION OF THE DRAWINGS

The accompanying drawings are included to provide a further understanding of the invention and are incorporated in and constitute a part of this specification The drawings illustrate exemplary embodiments of the invention and together with the description serve to explain the principles of the invention.

DETAILED DESCRIPTION OF THE ILLUSTRATED EMBODIMENTS

Reference will be made in detail to the specific embodiments of the present invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the present invention.

FIGS. 2A to 3H show some exemplary embodiments of the present disclosure. FIGS. 2A to 2G are cross-sectional views illustrating the exemplary steps of manufacturing a thin active matrix type organic light emitting diode display panel module according to the first embodiment of the present disclosure.

A base substrate GS having the rigidity enough for forming the display elements having the thin film transistor in stable condition is prepared. Here, the enough rigidity means that the base substrate GS is not bent or deformed so as to make negative effects on the properties of the display elements formed on the base substrate GS while the base substrate GS is transferred among various manufacturing equipments to conduct the depositing and patterning processes.

Figure 1:
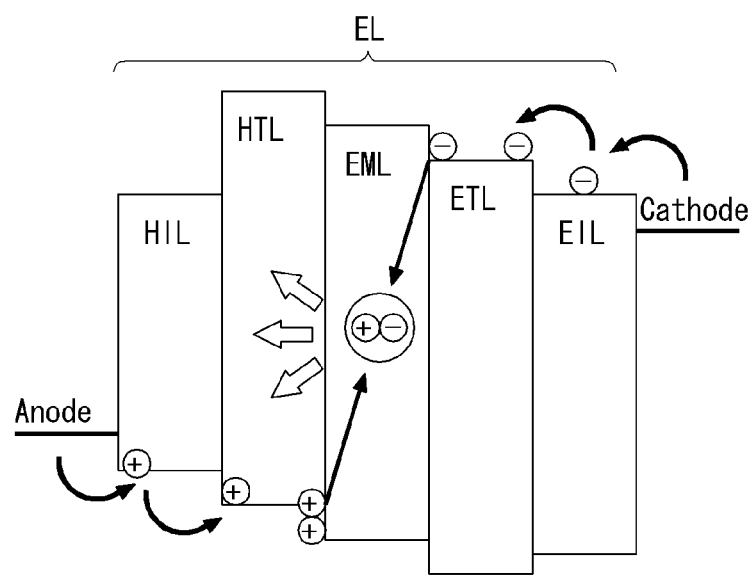
FIG. 1 illustrates the structure of the organic light emitting diode according to the related art.
Figure 2A:
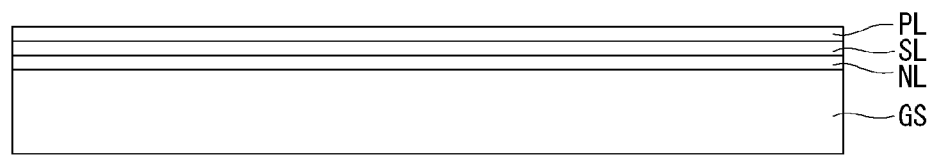
FIGS. 2A to 2G are cross-sectional views illustrating the steps of manufacturing a thin active matrix type organic light emitting diode display panel module according to the first embodiment of the present disclosure.

On a portion or on the whole surface of the base substrate GS, a buffer layer NL having a silicon nitride material is deposited for enhancing the insulating property and the evenness of the base substrate GS. On a portion or on the whole surface of the buffer layer NL, a silicon layer SL having the amorphous silicon material is deposited. After that, an organic layer PL is deposited on the silicon layer SL, as shown in FIG. 2A. In some embodiments, the organic layer PL is flexible. In additional embodiments, the organic layer includes an organic material having glass transition temperature of 400° C. or above and/or melting temperature of 600° C. or above. In further embodiments, the organic layer PL includes polyimide material.

Figure 2B:
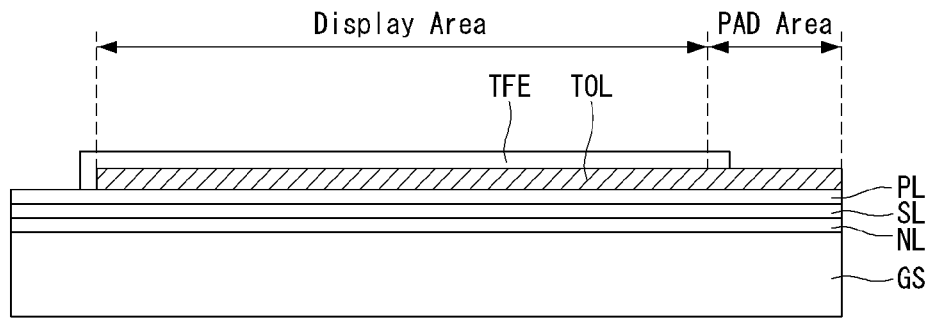

As shown in FIG. 2B, on the organic layer PL, a display element layer TOL is formed. The display element layer TOL according to some embodiments includes a display area for representing video data and a pad area extended from the display area. In the present disclosure, the display element layer TOL may be an organic light emitting diode display element comprising a plurality of the thin film transistors and the pixel area disposed in a matrix type, and an organic light emitting diode driven by the thin film transistor in each pixel area.

On the display element layer TOL, film elements for enhancing the quality of the video and for protecting the display element layer TOL may further be formed as described below. For example, the display element layer TOL may be encapsulated by a thin film type cap TFE to protect from the moistures and the gases. Some portion of the display element layer TOL may also be formed within the organic layer PL.

As shown in FIG. 2B, the display element layer TOL may extended to one end of the organic layer PL. This pad area includes the connecting line and the pad extended from the display element. Therefore, all display elements of the display element layer TOL may be fully encapsulated by the thin film type cap TFE. Also, the thin film type cap TFE may cover the display area of the display element layer TOL.

Figure 2C:
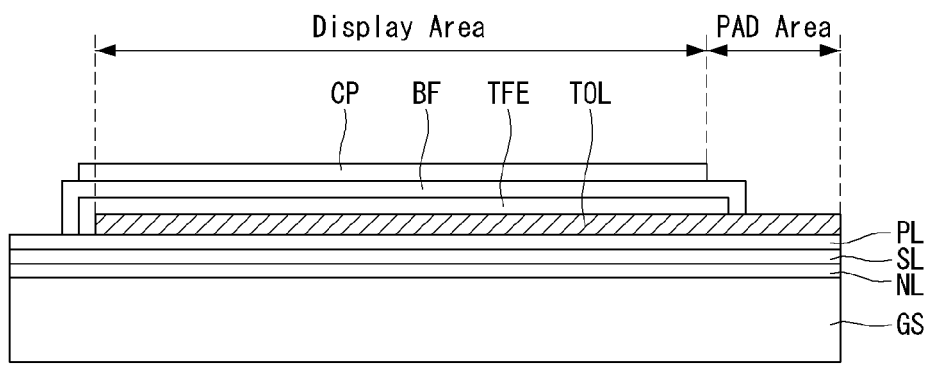

In order to reinforce the protection and the strength of the thin film type cap, a barrier film BF is formed to encapsulate a portion or the whole the display area of the display element layer TOL including thin film type cap TFE. The barrier film BF thus may cover the display area of the display element layer TOL. On the barrier film BF, a polarization film CP is attached. In particular, the polarization film according to some embodiments of the present invention may be a linear polarization film, an elliptical polarization film, or a circular polarization film. At this time, the polarization film CP, such as an circular polarization film, may cover a portion or the whole area of the display element radiating the light for representing the video data, as shown in FIG. 2C.

In some embodiments, on the pad area exposed (e.g. not covered by the thin film type cap, barrier film, and/or polarization film) at at least one side of the display panel (the right side in the drawing), a film type printed circuit board COF having a driving IC (not shown in the figure) for driving the display panel is attached. In further embodiments, in order to reinforce the adhesion of the film type printed circuit board COF and/or to make an even upper surface prior to attaching a cover plate, a reinforcing adhesive TUF is applied. The reinforcing adhesive TUF may include an acryl group organic adhesive material and/or the silicon group organic adhesive material in order to maintain the plane property with the polarization film CP. In some embodiments, the acryl group organic adhesive material may be a sealant of high viscosity. In further embodiments, the reinforcing adhesive TUF described herein may have the same or similar flexibility as cover film CF, adhesive layer ADH, display element layer TOL, organic layer PL.

Figure 2D:
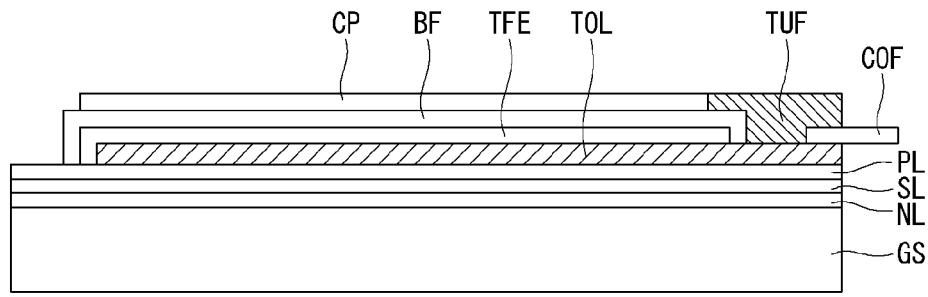

In some embodiments, as shown in FIG. 2D, the reinforcing adhesive TUF may be deposited to cover the film type printed circuit board COF and to fill the upper space exposed between the terminal portion of the film type printed circuit board COF which is attached on the pad area of the display element layer TOL and the end portion of the barrier film BF exposed (e.g. not covered by the polarization film CP) at the end side of the polarization film CP. In further embodiments, the reinforcing adhesive TUF may be deposited to cover the film type printed circuit board COF and to fill the upper space from the end side of the organic layer PL and the display element layer TOL to the end side of the polarization film CP.

In additional embodiments, a reinforcing adhesive TUF may be applied prior to attaching the film type printed circuit board COF (not shown in the figures). The reinforcing adhesive TUF may be deposited to cover the film type printed circuit board COF and to fill the upper space exposed between the terminal portion of the film type printed circuit board COF which is attached on the pad area of the display element layer TOL and the end portion of the barrier film BF. In further embodiments, the reinforcing adhesive TUF may be deposited to cover the film type printed circuit board COF and to fill the upper space from the end side of the organic layer PL and the display element layer TOL to the end side of the barrier film BF. Then, the polarization film CP may be placed above the barrier film BF and the reinforcing adhesive TUF.

Figure 2E:
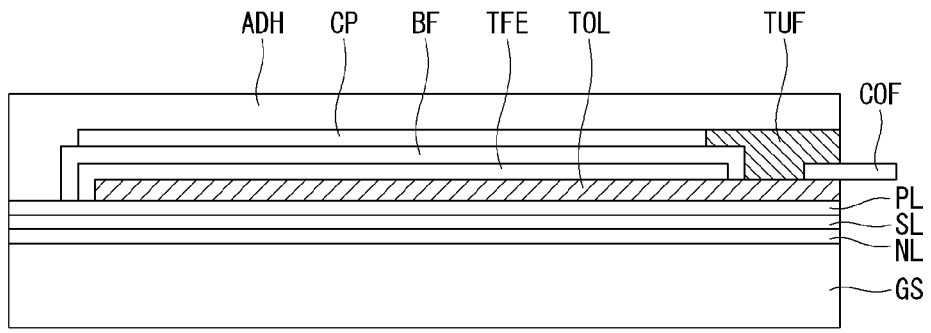
Figure 2F:
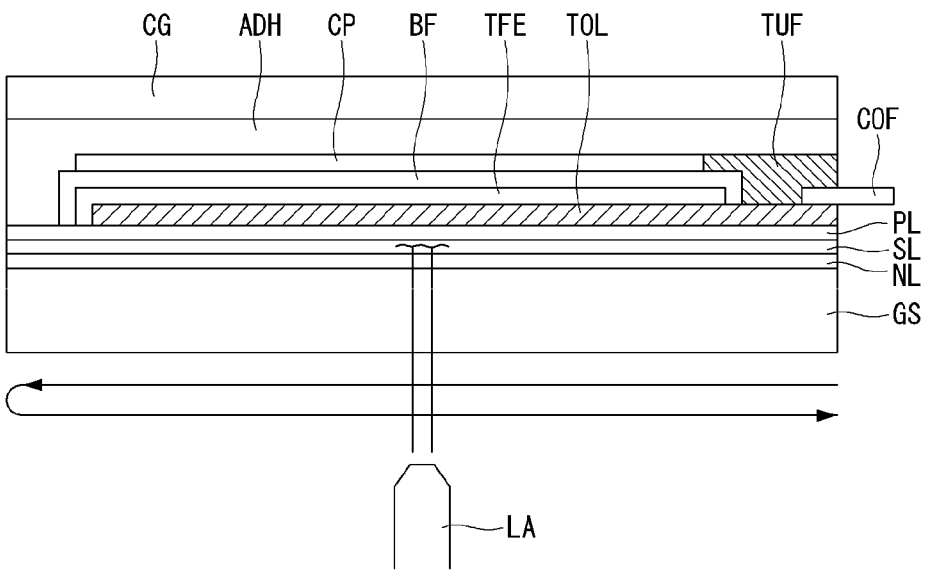

After reinforcing the adhesion of the film type printed circuit board COF to the display element layer TOL with the reinforcing adhesive TUF, an adhesive layer ADH is deposited over a portion or the whole surface of the base substrate GS, as shown in FIG. 2E. Especially, over the area covering the organic layer PL, the upper surface of the adhesive layer ADH is maintained evenly. In the present embodiment, the light emission is directed to the polarization film CP from the display element layer TOL. Therefore, the adhesive layer ADH according to some embodiments may be transparent. Further, the adhesive layer ADH may be composed of a material with a high ambient contrast ratio ACR to maintain its transparency during any heating or UV process. Furthermore, to improve the evenness of the upper surface of the adhesive layer ADH, the adhesive layer ADH may include the organic materials.

In additional embodiments, the adhesive layer ADH may include the optical bonding material which can be hardened by the UV light. For example, the adhesive layer ADH may include the organic optical bonding materials, such as the acrylate esters group, the acrylate urethanes group, mercaptons group and/or photo-initiator group.

In additional embodiments, the adhesive layer ADH may fully cover all elements formed on the base substrate GS, especially covering the reinforcing adhesive TUF fixing the film type printed circuit board COF to the display element layer TOL. As a result, the adhesion of the film type printed circuit board COF may be supported and ensured, protecting and securing the display elements.

A cover glass CG (or cover plastic), as the cover plate, may be attached on the adhesive layer ADH to complete a display panel. In some embodiments, a touch screen panel may also be attached to the adhesive layer ADH prior to attaching the cover glass CG (or cover plastic). In further embodiments, the cover glass CG (or cover plastic) may be first attached to the touch screen panel, and the combination of the cover glass CG (or cover plastic) and the touch screen panel may be attached to the adhesive layer ADH together.

Figure 2G:
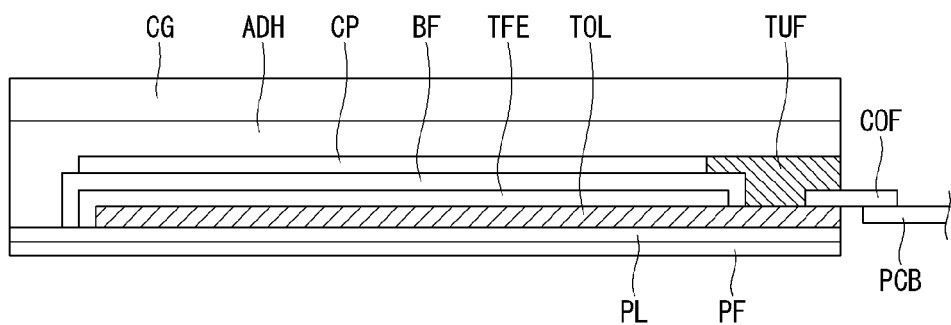

The cover glass CG may be thinner than the base substrate GS. Then, the silicon layer SL may be radiated by a laser beam LA from the rear side of the base substrate GS. The wavelength of the laser beam may be varied depending on the material of the silicon layer. For example, a green laser beam (e.g. having the wavelength of 532 nm) and/or UV laser beam (e.g. having the wavelength of 355 nm) may be radiated to the silicon layer SL including, but not limited to, amorphous silicon. In some embodiments, the laser beam LA may be scanned to cover all surface areas of the base substrate GS to radiate on the whole area of the silicon layer SL. As a result, the amorphous silicon of the silicon layer SL would be crystallized, so that the base substrate GS is separated from the organic layer PL. That is, the base substrate GS used for rigidity during the manufacturing processes may be removed from the flexible organic layer PL having the display elements thereon, as shown in FIG. 2G. In additional embodiments, the buffer layer NL and/or the silicon layer SL may be removed along with the base substrate GS.

The organic layer PL having the display elements separated from the base substrate GS may be too thin and weak to be used without other supportive layers, such as the base substrate GS, in a final product of the display device. Therefore, in further embodiments, a flexible protective film PF may be attached to the organic layer PL. Finally, the film type printed circuit board COF is connected to an external printed circuit board PCB to manufacture a display panel module. Referring to FIG. 2G, as the film type printed circuit board COF having high flexible property is supported by the cover glass CG with the adhesive layer ADH, hardness and rigidity for protecting the display elements is ensured, so that the connection between the film type printed circuit board COF to the external printed circuit board PCB would be reliable.

In the embodiments above where the cover glass CG is thinner than the base substrate GS, the display panel module having such cover glass CG may be thin but still maintains the rigidity.

Figure 3A:
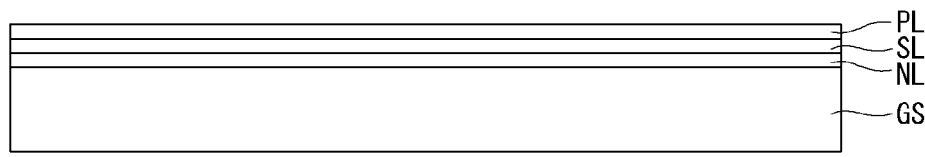
FIGS. 3A to 3H are cross-sectional views illustrating the steps of manufacturing a flexible active matrix type organic light emitting diode display panel module according to the second embodiment of the present disclosure.

In other embodiments, the present invention relates to a method of manufacturing the flexible organic light emitting display device module. FIGS. 3A to 3H are cross-sectional views illustrating the steps of manufacturing an exemplary flexible active matrix type organic light emitting diode display panel module On a portion or the whole surface of the base substrate GS, a buffer layer NL having a silicon nitride material is deposited for enhancing the insulating property and the evenness of the base substrate GS. On a portion of the whole surface of the buffer layer NL, a silicon layer SL having the amorphous silicon material is deposited. After that, an organic layer PL having the polyimide material is deposited on the silicon layer SL, as shown in FIG. 3A.

Figure 3B:
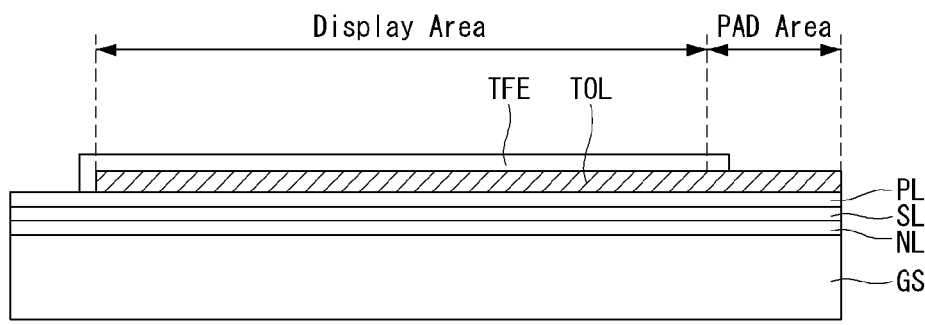

As shown in FIG. 3B, on the organic layer PL, a display element layer TOL is formed. The display element layer TOL may include a display area for representing video data and a pad area extended from the display area. On the display element layer TOL, various elements for enhancing the quality of the video data may further be formed. For example, the display element layer TOL may be encapsulated by a thin film type cap TFE to protect from the moistures and the gases, as shown in FIG. 3B.

Figure 3C:
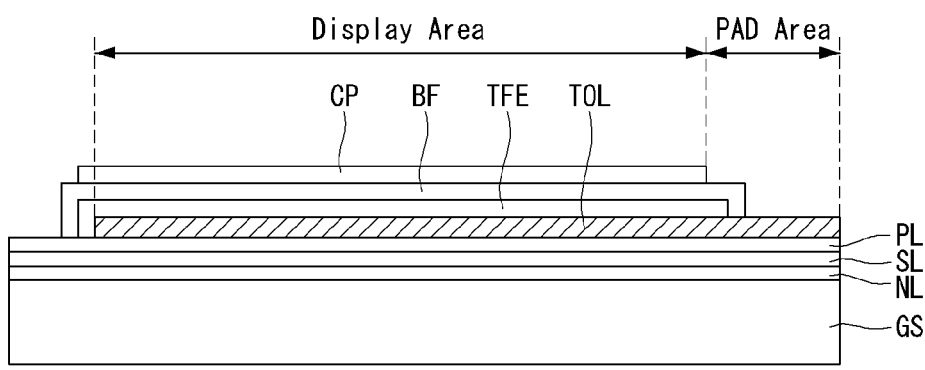

In order to reinforce the protection and the strength of the thin film type cap TFE, a barrier film BF is formed to encapsulate a portion or the whole display area of the display element layer TOL including thin film type cap TFE. On the barrier film BF, a polarization film CP is attached, as shown in FIG. 3C.

In some embodiments, on the pad area exposed (e.g. not covered by the thin film type cap, barrier film, and/or polarization film) at one side of the display panel (the right side in the drawing), a film type printed circuit board COF having a driving IC (not shown in the figure) for driving the display panel is attached. In order to reinforce the adhesion of the film type printed circuit board COF and/or to make even the upper surface of the step differences, a reinforcing adhesive TUF is applied. The reinforcing adhesive TUF may include the acryl group organic adhesive material and/or the silicon group organic adhesive material in order to maintain the plane property with the polarization film CP.

Figure 3D:
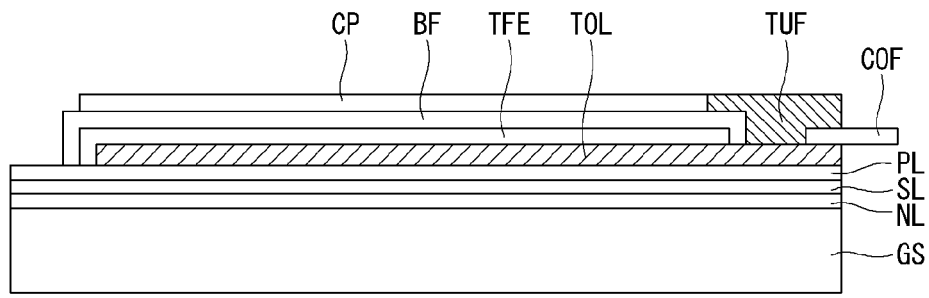

In some embodiments, as shown in FIG. 3D, the reinforcing adhesive TUF may be deposited to cover the film type printed circuit board COF and to fill the upper space exposed between the terminal portion of the film type printed circuit board COF which is attached on the pad area of the display element layer TOL and the end portion of the barrier film BF exposed (e.g. not covered by the polarization film CP) at the end side of the polarization film CP. In further embodiments, the reinforcing adhesive TUF may be deposited to cover the film type printed circuit board COF and to fill the upper space of an upper surface of the film type printed circuit board COF attached on the pad area and the upper exposed space from the pad area to an end of the display area, i.e., the upper space from the end side of the organic layer PL to the end side of the polarization film CP.

Figure 3E:
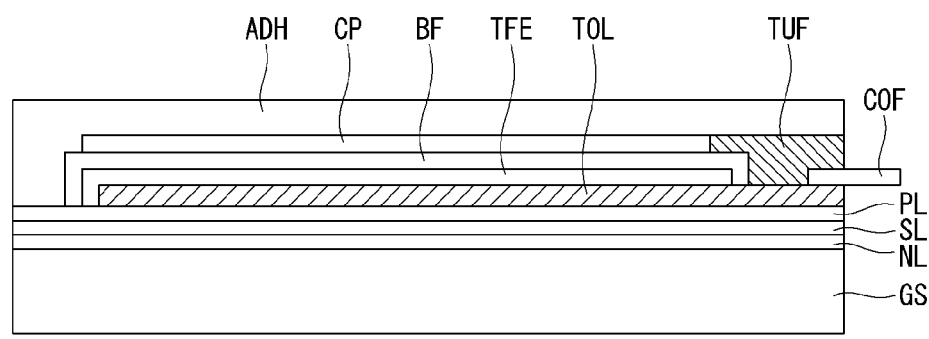

After reinforcing the adhesion of the film type printed circuit board COF to the display element layer TOL with the reinforcing adhesive TUF, an adhesive layer ADH is deposited over a portion or the whole surface of the base substrate GS, as shown in FIG. 3E. The adhesive layer ADH according to some embodiments may be transparent. Furthermore, to improve the evenness of the upper surface of the adhesive layer ADH, the adhesive layer ADH may include the organic materials. In additional embodiment, the adhesive layer ADH may include the optical bonding material which can be hardened by the UV light. For example, the adhesive layer ADH may include the organic optical bonding materials, such as the acrylate esters group, the acrylate urethanes group, mercaptons group and/or photo-initiator group.

In additional embodiments, the adhesive layer ADH may fully cover all elements formed on the base substrate GS, especially covering the reinforcing adhesive TUF fixing the film type printed circuit board COF to the display element layer TOL. As a result, the adhesion of the film type printed circuit board COF may be supported and ensured, protecting and securing the display elements.

Further embodiments relate to the method for manufacturing the exemplary flexible organic light emitting display panel. A cover film CF, as the cover plate, may be attached on the adhesive layer ADH. In some embodiments, a touch screen panel may also be attached to the adhesive layer ADH prior to attaching the cover film CF. In further embodiments, the cover film CF may be first attached to the touch screen panel, and the combination of the cover film CF and the touch screen panel may be attached to the adhesive layer ADH together.

In these embodiments for an exemplary flexible organic light emitting display, the cover film CF may be the thin and flexible film material, resulting in a problem when attaching the external printed circuit board PCB to the film type printed circuit board COF after removing the base substrate GS.

Figure 3F:
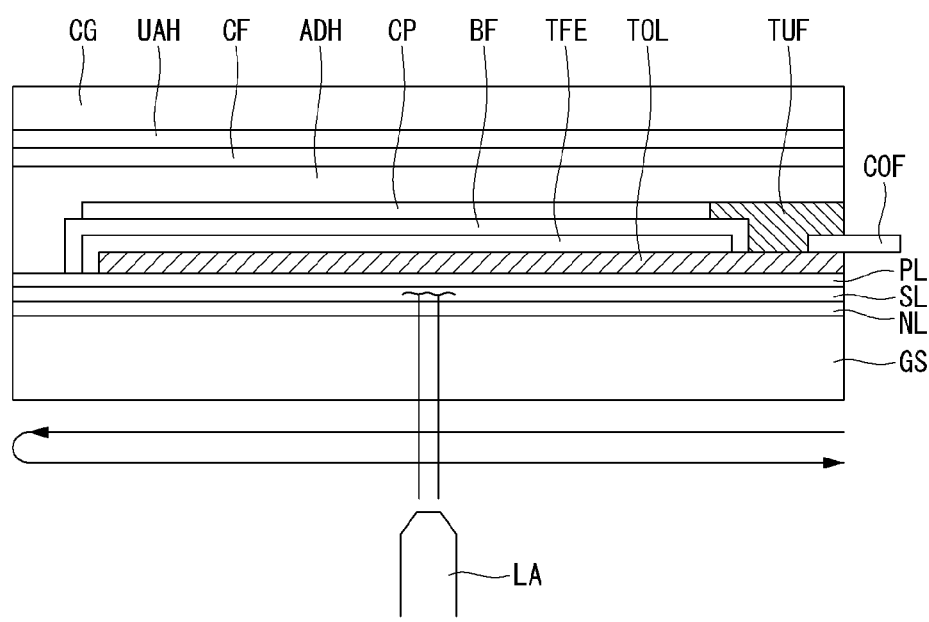

In order to solve these problems, a rigid plate, such as the cover glass CG, may be attached on the cover film CF. In further embodiments, as shown in FIG. 3F, a temporary adhesive layer UAH is deposited on a portion or the whole surface of the cover film CF between the cover glass CG and the cover film CF. On the temporary adhesive layer UAH, the cover glass CG may be attached.

Then, a laser beam LA described herein may be radiated to the silicon layer SL from the rear side of the base substrate GS. As a result, the phase of the amorphous silicon of the silicon layer SL would be changed, so that the base substrate GS is separated from the organic layer PL, as shown in FIG. 3G.

After removing the base substrate GS, a protective film PF may be attached on the rear side of the organic layer PL to protect the organic layer PL at the following processes. Finally, the film type printed circuit board COF is connected to an external printed circuit board PCB to manufacture the display panel module. As the cover glass CG having rigidity is supporting the display elements, there is no reliability problem when connecting the film type printed circuit board COF to the external printed circuit board PCB, as shown in FIG. 3G.

Figure 3G:
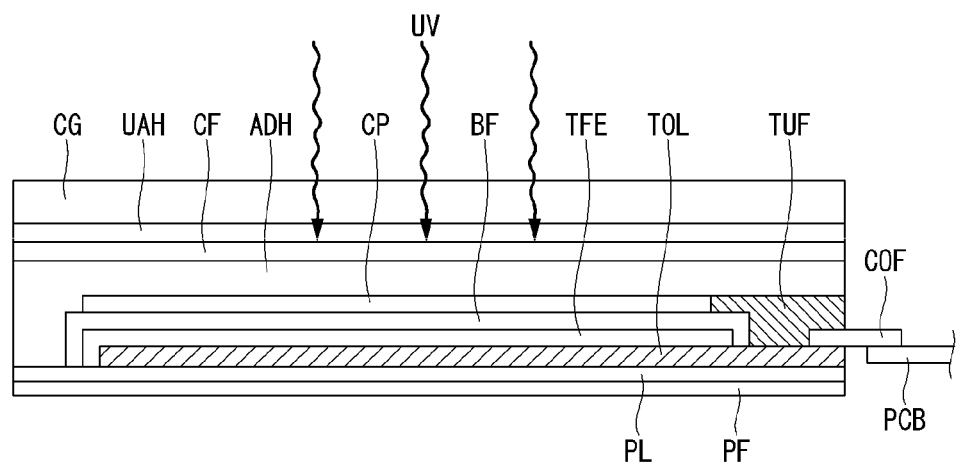
Figure 3H:
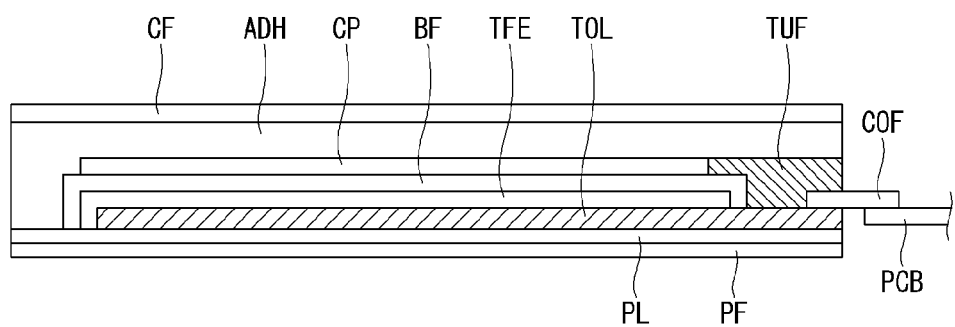

Then, as shown in FIG. 3G, an ultra violet light UV is radiated into the temporary adhesive layer UAH, for example, from the upper side of the cover glass CG. The temporary adhesive layer UAH may be degraded by the ultra violet light UV, and the cover glass CG may be separated from the cover film CF. For example, the temporary adhesive layer UAH may include, but is not limited to, a photoacryl polymer material. As a result, a flexible display panel module may have (i) the organic light emitting diode display elements formed between the flexible organic layer PL and the flexible cover film CF, (ii) the film type printed circuit board COF connected to the display elements, and (iii) the external printed circuit board PCB connected to the film type printed circuit board COF, as shown in FIG. 3H.

In the method for manufacturing the organic light emitting display panel module, as the cover plate may be attached to the display element using an optical organic adhesive material that is transparent and is improving the surface evenness of the display element, it is possible to keep the upper surface even and with a good display quality. Using the reinforcing adhesive material, the film type printed circuit board COF having driving IC for the display panel may be attached to the display panel that is stiff and tight. Therefore, the reliability of the display panel module can be ensured and enhanced.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. An organic light emitting display device, comprising:
    a flexible protective film;
    an organic layer directly on the flexible protective film;
    a display element layer directly on the organic layer, the display element layer comprising:
        at least one organic light emitting diode display element;
        a display area configured to display video data; and
        a pad area extended from the display area;
    film elements formed directly on the display element layer;
    a film type printed circuit board connected to the pad area;
    a reinforcing adhesive covering the film type printed circuit board, the reinforcing adhesive filling a space between the film type printed circuit board and the film elements, the reinforcing adhesive maintaining a planar property with the film elements;
    an adhesive layer on the film elements and the reinforcing adhesive; and
    a cover plate attached on the adhesive layer.

2. The device according to claim 1, wherein the organic layer comprises a polyimide.

3. The device according to claim 1, wherein the reinforcing adhesive comprises one or more of: an acryl group material and a silicon group material.

4. The device according to claim 1, wherein the reinforcing adhesive covers:
    an upper space of an upper surface of the film type printed circuit board attached on the pad area; and
    an upper exposed space from the pad area to the adhesive layer.

5. The device according to claim 1, wherein the cover plate comprises one or more of: a cover film, and/or a cover glass, and a cover plastic.

6. The device according to claim 1, wherein the film elements comprises:
    a thin-film type cap encapsulating the display area;
    a barrier film covering the thin-film type cap and the display area; and
    a polarization film attached on the barrier film covering the display area.

7. The device according to claim 6, wherein the reinforcing adhesive covers:
    an upper space of an upper surface of the film type printed circuit board attached on the pad area; and
    an upper exposed space from the pad area to the polarization film.

8. The device according to claim 1, wherein the adhesive layer comprises a material selected from: an acrylate esters group material, an acrylate urethanes group material, a mercaptons group material, a photo-initiator group material, and a combination thereof.

9. The device according to claim 1, further comprising a protective film attached on a rear side of the organic layer.

* * * * *